United States Patent [19]

Schlicht

[11] Patent Number: 5,381,082
[45] Date of Patent: Jan. 10, 1995

[54] HIGH-SPEED, FULLY-ISOLATED CURRENT SOURCE/SINK

[75] Inventor: Michael Schlicht, Mountain View, Calif.

[73] Assignee: National Semiconductor Corporation, Santa Clara, Calif.

[21] Appl. No.: 999,573

[22] Filed: Dec. 30, 1992

Related U.S. Application Data

[63] Continuation of Ser. No. 765,589, Sep. 25, 1991, abandoned.

[51] Int. Cl.6 .................................................. G05F 1/44
[52] U.S. Cl. ........................................ 323/280; 323/281; 323/312; 363/73
[58] Field of Search .............. 323/280, 281, 312, 902, 323/316, 273, 303; 363/73

[56] References Cited

U.S. PATENT DOCUMENTS

| 4,441,068 | 4/1984 | Smith | 323/351 |
| 4,618,814 | 10/1986 | Kato et al. | 323/280 |
| 5,179,355 | 1/1993 | Harvey | 330/265 |
| 5,180,932 | 1/1993 | Bengel | 307/353 |
| 5,191,297 | 3/1993 | Penman et al. | 330/146 |

FOREIGN PATENT DOCUMENTS

0240618A2 10/1986 European Pat. Off. .

Primary Examiner—Steven L. Stephan
Assistant Examiner—Adolf Berhane
Attorney, Agent, or Firm—Limbach & Limbach

[57] ABSTRACT

A high-speed, fully-floating, current source/sink utilized a current mode operational amplifier to drive a power MOSFET without ringing or instability. The output of the current mode op amp is directly connected to the MOSFET gate. The current source relies on an optical link to enable an analog switch to generate carefully controlled pulse width characteristics at the positive input of the op amp.

5 Claims, 4 Drawing Sheets

HIGH-SPEED, FULLY-ISOLATED CURRENT SOURCE/SINK

This is a continuation of co-pending application Ser. No. 07/765,589, filed on Sep. 25, 1991 now abandoned.

BACKGROUND OF THE INVENTION

1. Field of the Invention

The present invention relates to current sources and, in particular, to a high-speed, fully-isolated, high-power current source/sink that uses a current mode op amp to drive a power MOSFET as the current regulating device.

2. Discussion of the Prior Art

For ideal operation, certain electrical systems, e.g. integrated circuit tester environments, require a current source with highly stable signal characteristics. However, as described in greater detail below, conventional current sources typically experience stability problems due to loss of phase margin. In order to guarantee stability of the current source over the full dynamic range required for tester operation, the speed of the current source must be reduced to less than ideal.

FIG. 1 shows a conventional current source 10 configured as a voltage-to-current converter. The current source 10 utilizes a conventional operational amplifier 12 to drive an n-channel power MOSFET device 14. The drain current of the power MOSFET 14 is sensed by a sense resistor, represented in FIG. 1 by resistor $R_{sense}$.

Power MOSFETs, however, have several characteristics that make them difficult to use in the "linear" mode. First, power MOSFETs have large gate capacitances (approximately 800 pf for a 20 amp pulse output) which are proportional to the output current. Therefore, they require relatively large gate currents to turn on or off fast. Also, in the linear mode, power MOSFETs are prone to parasitic oscillation (self-oscillation) at a frequency of about 100 MHz. This behavior can be modeled as a simple grounded gate oscillator where the sense resistor Rsense is effectively the load.

As further shown in FIG. 1, one technique for compensating for the above-mentioned deficiencies of power MOSFETs in current source applications is to provide a series resistor $R_g$ between the output of op amp 12 and the gate of the power MOSFET 14. The resistor $R_g$ both isolates the capacitive load of the MOSFET gate from the operational amplifier 12 and reduces the "Q" (gain) of the MOSFET 14, preventing parasitic oscillation. Inclusion of the series resistor $R_g$ does not completely solve the oscillation problem, however, because it takes away the phase error margin of the operational amplifier 12 by increasing the feedback delay to the op amp's negative input. Even if a small value series resistor $R_g$ is used, the resistor $R_g$ in combination with the large gate capacitance of a power MOSFET 14 results in a large RC delay component. In addition, Miller capacitance resulting from the inclusion of the series resistor $R_g$ adds to the feedback delay. This increased delay almost always exceeds the phase margin of the operational amplifier 12.

To retrieve the phase margin, a capacitor C is typically added between the output of the operational amplifier 12 and its negative input. However, the added capacitor C slows down the overall response time of the operational amplifier 12, causing it to lose all high frequency response. In addition, the capacitor C must be large to handle the wide range (typically 10 volts–200 volts) of the load.

It would, therefore, be highly desireable to have available a high power current source that remains stable during high speed operation.

SUMMARY OF THE INVENTION

The present invention provides a high-speed, fully-floating current source that utilizes a current mode operational amplifier to drive a power MOSFET without ringing or instability. The op amp is directly connected to the MOSFET to provide the very fast current rise and fall times needed for high speed operation. The current source relies on an optically coupled pulse to enable an analog switch that generates an input pulse having very carefully controlled characteristics. The optical coupling together with an isolated DC/DC converter power source and an internal programmed voltage storage capacitor provides full isolation for the current source, enabling it to be used as either a source or a sink.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTIONS

Figure 2:
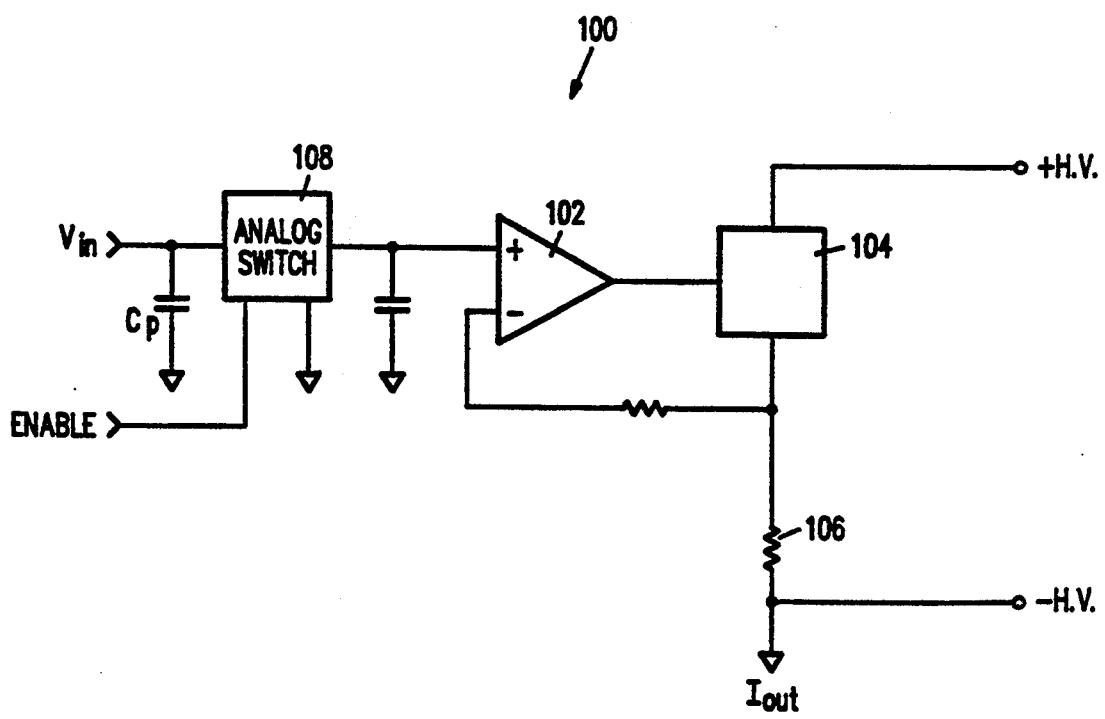
FIG. 2 is a block diagram illustrating a high-speed, fully-isolated high-power current source/sink in accordance with the present invention.

FIG. 2 shows a current source/sink 100 configured as a voltage-to-current converter circuit. The current source/sink 100 utilizes a current mode operational amplifier 102 to drive a power MOSFET 104 as the current regulating element. The output of the op amp 102 is connected directly to the gate of MOSFET 104. A current sense resistor 106 in series with the source lead of the power MOSFET 104 is used to set and control the output current Iout. The current sense is fed back into the negative input (current input) of the operational amplifier 102. The negative input of the operational amplifier 102 is a true low impedance input that is a good match to the low impedance of the sense resistor 106 and provides very fast response to any change in output current Iout.

The current source/sink 100 receives an input pulse from a high performance analog switch 108 based on charge stored at programming capacitor Cp. The programming capacitor Cp is first charged to a voltage level equivalent to the desired current output. This is accomplished in the conventional manner using a relay network to first charge the capacitor Cp to its desired level and then isolate it. The analog switch 108 is then enabled and generates the pulse width characteristics of the signal applied to the positive input of the operational amplifier 102.

Figure 3:
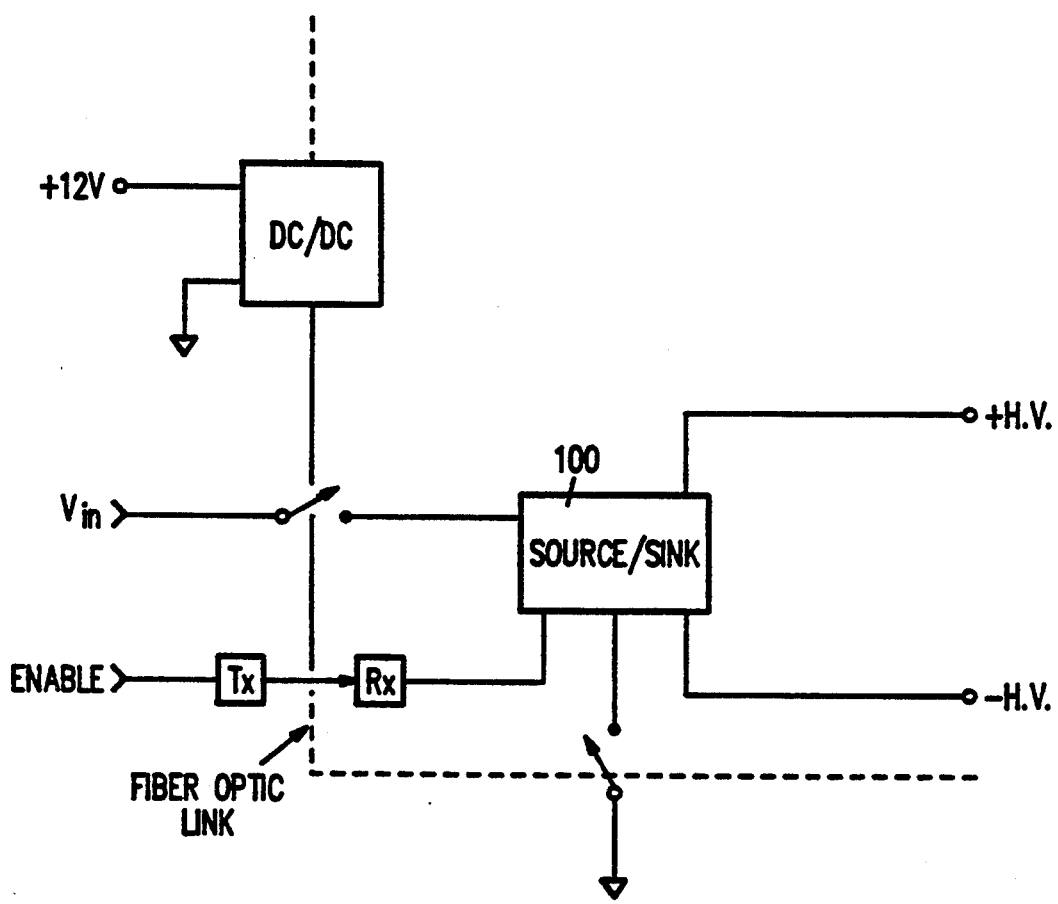
FIG. 3 is a block diagram illustrating a fiber optic link utilizable in conjunction with the FIG. 1 current source/sink circuit.

In accordance with an aspect of the present invention, and as shown in FIG. 3, a fiber optic link provides an optically coupled enabling pulse to the analog switch 108 for a time period equal to the desired pulse width of the current output Iout. FIG. 3 shows the fiber optic link together with an isolated DC/DC converter power source and relays used to disconnect the input signal $V_{in}$ from the programmed voltage storage capacitor.

Figure 4:
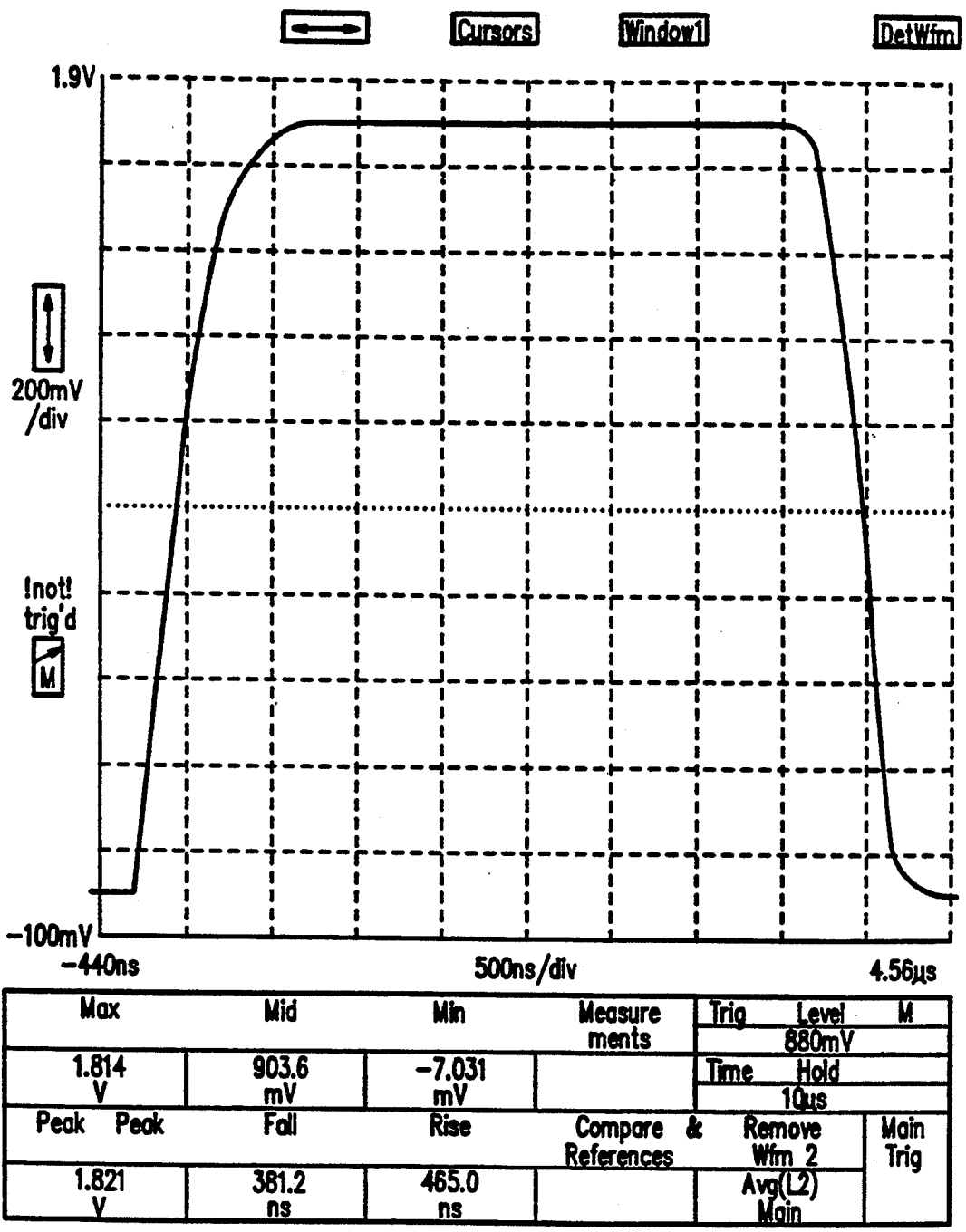
FIG. 4 is a graph illustrating the voltage characteristics of an input pulse generated by an analog switch utilizable in conjunction with the present invention.

FIG. 4 provides a plot of the signal pulse provided by the analog switch 108 at the positive input of operational amplifier 102. As stated above, to program the current, capacitors $C_p$, which is in parallel with the input of the analog switch 108, is charged to the desired voltage, i.e. output current. Once the capacitor $C_p$ is charged, it is disconnected from the programming source and will then hold the programming voltage. This then sets the amplitude of the current pulse and maintains the isolation of the circuit.

Figure 5:
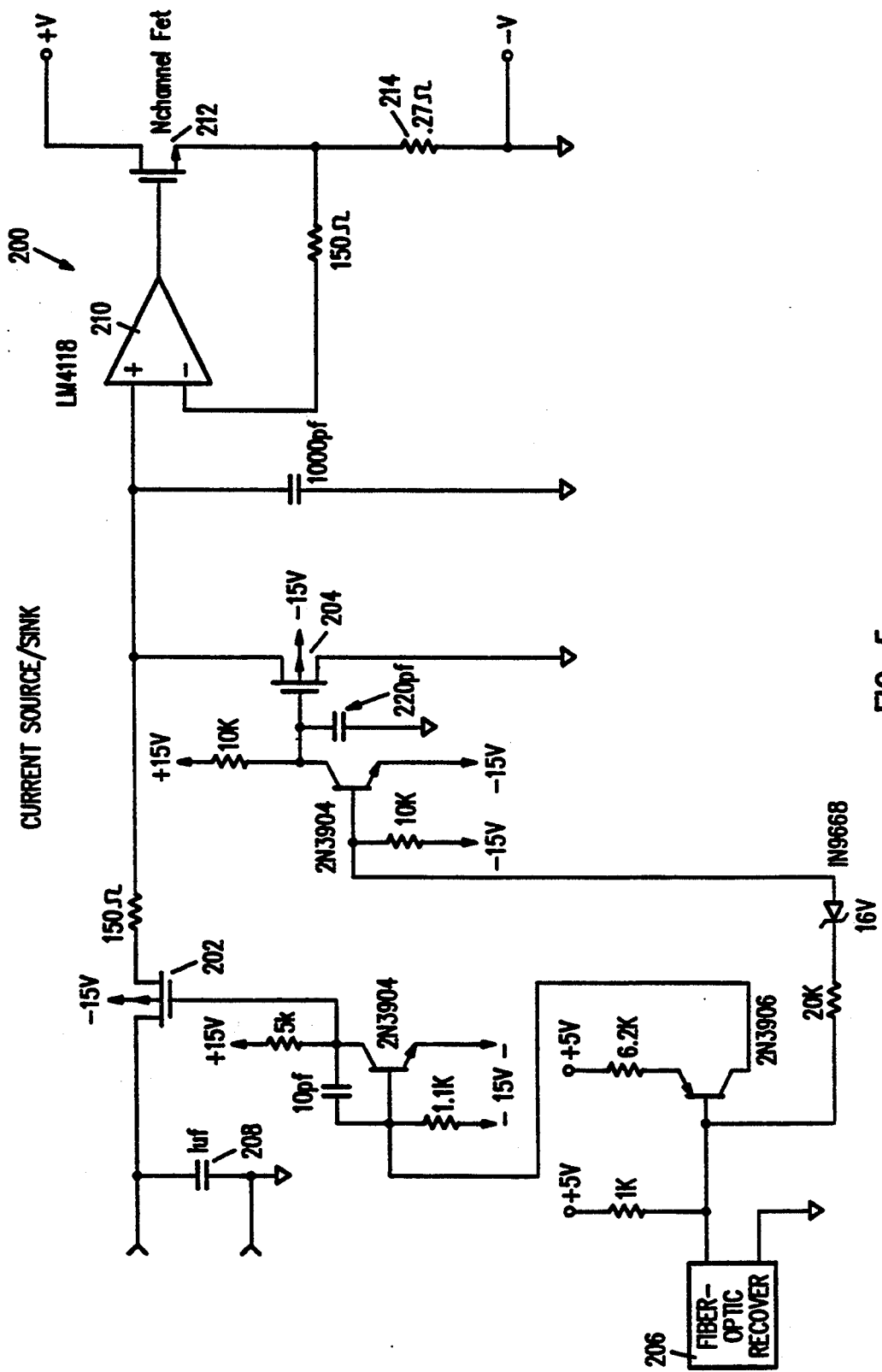
FIG. 5 is a schematic diagram illustrating an embodiment of a high-speed high-power fully-isolated, current source/sink circuit in accordance with the present invention.

As shown in FIG. 5, the analog switch is a true break before make SPDT switch. One side of the switch, i.e. n-channel FET 204, is connected to circuit ground and the other side, i.e. n-channel FET 202, is connected to the programming capacitor 208. The break before make feature keeps the programming capacitor 208 from discharging during the analog switch's cross-over and is necessary to eliminate glitches on the rising and falling edges of the current pulse.

The analog switch 108 also controls the rising and falling edges of the current pulse. As shown in FIG. 4, the rising edge of the pulse has an RC roll-off characteristic to prevent overshoot. The falling edge has a slow start to turn-off to minimize dI/dt-induced dV/dt and a controlled slew for the rest of the turn-off.

The flatness at the top of the FIG. 4 curve is a direct result of the use of the analog switch 108.

As stated above, operational amplifier 102 is a current mode op amp. Current mode op amps are optimized for their loop response characteristic for the current mode input (i.e. negative input). With a fast enough current mode op amp, it is possible to compensate for the tendency of the power MOSFET 104 to go into parasitic oscillation (which occurs in the 80–120 MHz range) by sensing the deviation in output current and controlling the gate voltage of the MOSFET 104 to prevent it. It is also necessary in practical circuits to drive the gate of the MOSFET 104 as directly as possible (i.e. without a series resistor of the type utilized in the prior art) since any gate resistor large enough to prevent parasitic oscillation will generate too much delay (phase shift). This delay both slows down the response of the MOSFET 104 to any correction factor the op amp 102 is trying to provide and also decreases the phase margin (stability) of the circuit.

The optimum op amp drive for the MOSFET gate is a constant current. The current should be of such a magnitude so as to be able to slew the gate voltage fast enough to prevent parasitic oscillation, but not so fast so as to generate excessive gain in the feedback loop and so destabilize the op amp.

Figure 1:
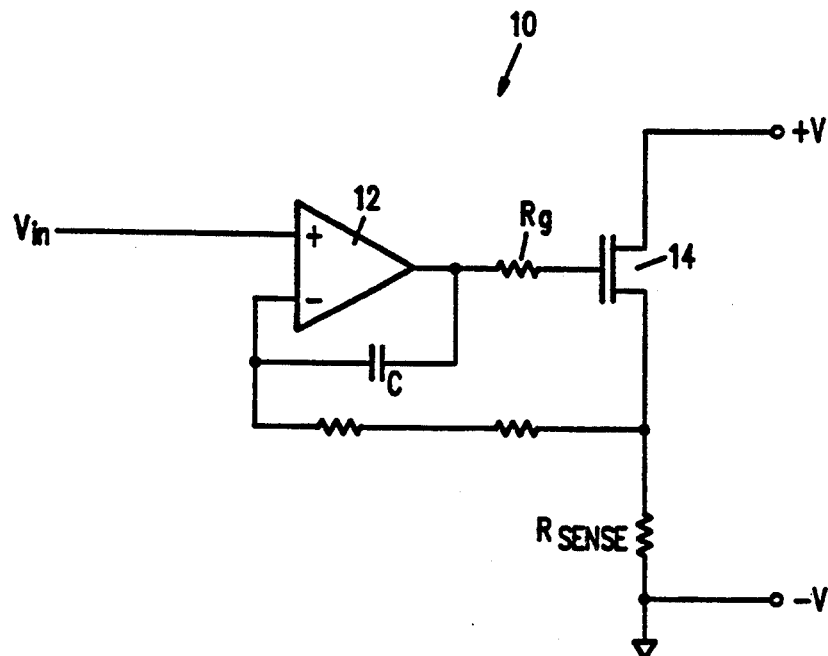
FIG. 1 is a block diagram illustrating a conventional voltage-to-current current source.

This concept is fundamentally different from the conventional state of the art solution, which normally uses a series gate resistor to prevent parasitic oscillation and a capacitor connected from the output to the negative input of the op amp to restore phase margin (stability), as shown in FIG. 1. Unfortunately, as stated above, this slows down the response time of the current source tremendously.

Referring back to FIG. 2, to minimize any start up or turn off transients, the current source/sink 100 is always on. To keep the output current at virtual 0 amps, the very high performance analog switch 108 keeps the input to the current source at 0 volts, which sets the output current to 0 amps, except for MOSFET leakage. The input offset is also nulled to zero. With the current source/sink 100 always on, smooth, stable startup is easier to achieve.

FIG. 5 provides a schematic illustration of a circuit embodiment of a current source/sink circuit 100 in accordance with the present invention.

The FIG. 5 circuit includes an analog switch which, as described above, is based upon n-channel transistors 202 and 204. Fiber optic receiver 206 responds to an optical input enable signal to couple 1 microfarad programming capacitor 208 to the positive input of current mode operational amplifier 210. In the FIG. 5 embodiment, current mode operational amplifier 210 is a LM4118 operational amplifier available from National Semiconductor Corporation. The LM4118 op amp is able to drive large capacitive loads without ringing. The output of operational amplifier 210 drives n-channel power MOSFET 212. Power FET 212 provides the output current at its drain via 0.27 ohm sense resistor 214. The sense current is fed back to the negative input of op amp 210.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A current source/sink circuit for generating a desired output current signal, the circuit comprising:

a pulse generator that generates an input pulse signal having predefined pulse waveform characteristics;

an operational amplifier having an inverting input node, a non-inverting input node connected to receive the input pulse signal, and an output node; and a power MOSFET having its drain connected to a supply voltage, its source connected to ground via a load, the source also being coupled to the inverting input of the operational amplifier to provide a feedback loop, and its gate connected directly to the output node of the operational amplifier to receive a gate drive signal directly therefrom, the power MOSFET being subject to parasitic oscillation within a frequency range when operating in the linear mode; p1 wherein the gain of the operational amplifier is great enough to prevent parasitic oscillation of the power MOSFET in the frequency range; and wherein the pulse generator includes a programming capacitor selectively connectable to a charging voltage programming source for charging the programming capacitor to a desired input pulse voltage level;

a programming switch connected between the programming capacitor and the charging voltage programming source and operable to disconnect the programming capacitor from the charging voltage programming source after the programming capacitor has been charged to the desired input pulse voltage level;

a switching network coupled between the programming capacitor and the non-inverting input node of the operational amplifier, the switching network being responsive to an optically-coupled enable pulse signal to provide the input pulse signal from the programming capacitor to the non-inverting input node; and a fiber optic link optically coupled to the switching network to provide the enable pulse signal to the switching network for a time period equal to a desired pulse width of the output current signal.

2. A current source/sink circuit as in claim 1 and further comprising a sense capacitor connected between the non-inverting input of the operational amplifier and ground.

3. A current source/sink circuit for generating a desired output current signal, the circuit being operable in the 80–120 MHz range, the circuit comprising:

an operational amplifier having an inverting input node, a non-inverting input node and an output node;

a pulse generator that generates an input signal having predefined pulse waveform characteristics, the pulse generator including (i) a programming capacitor selectively connectable to a charging voltage programming source for charging the programming capacitor to a desired input pulse voltage level;

(ii) a programming switch connected between the programming capacitor and the charging voltage programming source and operable to disconnect the programming capacitor from the charging voltage programming source after the programming capacitor has been charged to the desired input pulse voltage level;

(iii) a switching network coupled between the programming capacitor and the non-inverting input node of the operational amplifier, the switching network being responsive to an optically-coupled enable pulse signal to provide the input pulse signal to the non-inverting input node; and (iv) a fiber optic link optically coupled to the switching network to provide the enable pulse signal to the switching network for a time period equal to a desired pulse width of the output current signal; and a power MOSFET having its drain node connected to a supply voltage, its source node connected to ground via a load, the source node also being coupled to the inverting input of operational amplifier via a resistor to provide an output current feedback signal to the inverting input, and its gate node connected directly to the output node of the operational amplifier to receive a gate drive signal directly therefrom.

4. A circuit as in claim 3 and wherein the load comprises a current sense resistor connected in series with the source node of the power MOSFET for setting and controlling the output current signal.

5. A circuit as in claim 4 wherein the impedance of the inverting input of the operational amplifier is matched to the impedance of the sense resistor whereby the operational amplifier provides a fast response to changes in the output current signal.

* * * * *